(12) United States Patent
Lin (10) Patent No.: US 6,859,577 B2
(45) Date of Patent: Feb. 22, 2005

(54) SELF ASSEMBLED MICRO ANTI-STICTION STRUCTURE

(75) Inventor: Chuang-Chia Lin, San Pablo, CA (US)

(73) Assignee: Analog Devices Inc., Norwood, MA (US)

(*) Notice: Subject to any disclaimer, the term of this patent is extended or adjusted under 35 U.S.C. 154(b) by 66 days.

(21) Appl. No.: 09/891,760

(22) Filed: Jun. 25, 2001

(65) Prior Publication Data

US 2002/0197002 A1 Dec. 26, 2002

(51) Int. Cl.⁷ .............................. G02B 6/42; G02B 6/26
(52) U.S. Cl. .......................................... 385/18; 385/25
(58) Field of Search .............................. 385/15, 18, 23, 385/24, 25, 83, 88, 94

(56) References Cited

U.S. PATENT DOCUMENTS

| | | | |
|---|---|---|---|
| 5,411,769 A | | 5/1995 | Hornbeck .................... 427/534 |
| 5,512,374 A | | 4/1996 | Wallace et al. ............. 428/422 |
| 5,629,918 A | | 5/1997 | Ho et al. .................... 369/112 |
| 5,867,302 A | * | 2/1999 | Fleming ...................... 359/291 |
| 6,025,951 A | * | 2/2000 | Swart et al. ................. 359/245 |
| 6,114,044 A | | 9/2000 | Houston et al. ............ 428/447 |
| 6,215,921 B1 | * | 4/2001 | Lin .............................. 385/18 |
| 6,341,039 B1 | * | 1/2002 | Flanders et al. ............ 359/578 |
| 6,396,975 B1 | * | 5/2002 | Wood et al. ................. 385/18 |
| 6,498,870 B1 | | 12/2002 | Wu et al. ..................... 385/18 |
| 6,523,961 B2 | | 2/2003 | Ilkov et al. .................... 353/99 |
| 6,538,798 B2 | * | 3/2003 | Miller et al. ................ 359/291 |
| 6,600,591 B2 | * | 7/2003 | Anderson et al. ........... 359/291 |
| 6,639,572 B1 | * | 10/2003 | Little et al. ................... 345/55 |
| 6,668,109 B2 | * | 12/2003 | Nahum et al. ................ 385/18 |
| 6,674,562 B1 | * | 1/2004 | Miles ........................... 359/291 |

OTHER PUBLICATIONS

R. Legtenberg et al., "Stiction of surface micromachined structures after rinsing and drying: model and investigation of adhesion mechanisms", Sensors and Actuators A, 43, pp 230–238, 1994.

(List continued on next page.)

Primary Examiner—Chandrika Prasad
(74) Attorney, Agent, or Firm—JDI Patent; Joshua D. Isenberg (57) ABSTRACT

A method and apparatus are described for reducing stiction in a MEMS device having a movable element and a substrate. The method generally comprises providing the substrate with an anti-stiction member and interposing the anti-stiction member between the moveable element and the substrate. The apparatus generally comprises an anti-stiction member that is interposable between the moveable element and the substrate. Another embodiment of the invention of the invention is directed to a MEMS device, comprising: a substrate, a moveable element moveably coupled to the substrate, and an anti-stiction member that is interposable between the moveable element and the substrate. A further embodiment of the invention is directed to an optical switch having one or more moveable elements moveably coupled to a substrate, and an anti-stiction member that is interposable between at least one of the moveable elements and the substrate. The anti-stiction member may be in the form of a flexible cantilevered structure that overhangs the moveable element. Actuating the moveable element causes the anti-stiction member to flex and snap into place between the moveable element and the substrate. An additional embodiment of the invention is directed to a method of fabricating a MEMS device. The method proceeds by providing a silicon-on-insulator (SOI) substrate; defining a moveable element from a device layer of the SOI substrate; and depositing a flexible material over the device layer and the moveable element. One or more portions of the flexible material overhang the moveable element, whereby the flexible material forms one or more anti-stiction members.

34 Claims, 7 Drawing Sheets

OTHER PUBLICATIONS

H. Guckel et al, "Fabrication of Micromechanical Devices from Polysilicon Films with Smooth Surfaces", *Sensors and Actuators*, 20 pp 117–122 (1989).

R. Alley et al, "The Effect of Release–Etch Processing on Surface Microstructure Stiction", Proc. IEEE Solid–State Sensor & Actuator Workshop, Hilton Head Island, S.C., pp. 202–207 (1992).

D. Kobayashi et al., "An Integrated Lateral Tunneling Unit" Proc. IEEE Micro Electro Mechanical Systems, Travemunde Germany, pp 214–219, (1992).

N. Takeshima et al. Proc. Int. Conf. Solid–State Sensors & Actuators (Transducers '91), San Francisco, CA, pp. 63–66, (1991, IEEE, New York)).

C. Mastrangelo and C. Hsu, "Mechanical Stability and Adhesion of Microstructures Under Capillary Forces—Part I: Basic Theory" *Journal of Microelectromechanical Systems*, vol. 2, No. 1 (Mar. 1993) pp. 33–43.

C. Mastrangelo and C. Hsu, "Mechanical Stability and Adhesion of Microstructures Under Capillary Forces—Part II: Experiments" *Journal of Microelectromechanical Systems*, vol. 2, No. 1, (Mar. 1993) pp. 44–55.

Storment, C., Flexible, Dry–Released Process for Aluminum Electrostatic Actuators, Sep. 1994, pp. 90–96.

Provisional Patent Application of Behrang Behin et al., "Global Mechanical Stop for Precise Positioning of a Field of Mirrors", filed Mar. 9, 1999.

L. Y. Lin, et al, Free Space Micromachined Optical Switches with Submillisecond Switching Time for Large–Scale Optical Crossconnects, IEEE Photonics Technology Letters, vol. 10, No. 4, Apr. 1998.

U.S. Appl. No. 09/489,264 of Robert L. Wood et al, "MEMS Optical Cross–Connect Switch", filed Jan. 20, 2000.

U.S. Appl. No. 09/511,428 of Behrang Behin et al, "Cantilevered Microstructure Methods and Apparatus", filed Feb. 23, 2000.

* cited by examiner

SELF ASSEMBLED MICRO ANTI-STICTION STRUCTURE

FIELD OF THE INVENTION

This invention relates generally to microelectromechanical structures (MEMS). More particularly, it relates to reducing stiction in MEMS devices such as those used in optical switches.

BACKGROUND OF THE INVENTION

Microelectromechanical systems (MEMS) are miniature mechanical devices manufactured using the techniques developed by the semiconductor industry for integrated circuit fabrication. Such techniques generally involve depositing layers of material that form the device, selectively etching features in the layer to shape the device and removing certain layers, known as sacrificial layers, to release the device. Such techniques have been used, for example, to fabricate miniature electric motors as described in U.S. Pat. No. 5,043,043.

Silicon-on-insulator (SOI) techniques have been developed for fabricating MEMS devices. In SOI, an oxide layer is grown or deposited on a silicon wafer. A second silicon wafer is then bonded to the oxide layer, e.g. by fusion bonding. After bonding, the second silicon wafer is ground back and polished such that a thin layer of silicon is left attached to the oxide layer to form an SOI substrate. SOI substrates are particularly useful for MEMS devices where a moveable element formed from a silicon device layer is to be electrically insulated from an underlying support layer.

Recently, MEMS devices have been developed for optical switching. Such systems typically include an array of mechanically actuatable mirrors that deflect light from one optical fiber to another. Such MEMS optical switches are described, for example in U.S. Pat. No. 5,960,132. The mirrors are configured to translate or rotate into the path of the light from the fiber. Mirrors that rotate into the light path generally rotate about a substantially horizontal axis, i.e., they "flip up" from a horizontal position into a vertical position. MEMS mirrors of this type are usually actuated by magnetic interaction, electrostatic interaction, thermal actuation or some combination of these.

When the mirror is in the horizontal position, it rests against a substrate that forms a base. Often, the mirror is subject to electromechanical forces, sometimes referred to as "stiction" that cause the mirror to stick to the substrate and prevent the mirror from rotating. In addition, stiction forces can also prevent the mirror from being properly released from the substrate during manufacture. The mechanism by which stiction occurs can be divided into two stages: (a) mechanical collapse of the released portion of the microstructure to contact or move very close to the substrate and (b) adhesion of the released portion of the microstructure to the substrate. The microstructure's mechanical collapse can be initiated by high surface tension forces resulting from etchant rinse liquid trapped in the capillary-like spaces between the microstructure and the substrate, or by residual electric charges on the microstructure and/or the substrate. Several mechanisms have been proposed to explain the adhesion of the microstructure to the substrate, including solid bridging, liquid bridging, Van der Waals forces, and hydrogen bonding. Often the stuck part can be separated with increased force, but sometimes a permanent bond is formed after the initial contact.

A number of techniques have been developed to avoid stiction. One technique is to reduce the real contact area between the released portion of the microstructure and the underlying substrate either through nanoscale roughness intrinsic to one or both surfaces or through the formation of microscale standoffs in the form of bumps or "dimples" on the microstructure. However, such standoffs are difficult to fabricate, particularly when they are to be fabricated from the device layer of an SOI substrate. Consequently the stand-offs add an additional level of complexity to the fabrication of the MEMS device. The additional complexity increases the cost and reduces the yield of usable MEMS devices. Another group of stiction-inhibition techniques eliminates the source of surface tension between the released portion of microstructure and the substrate and prevents the microstructure's initial collapse by eliminating the gas-liquid interface. A third alternative procedure utilizes a self-assembled monolayer to reduce the surface energy. Often, a combination of two or more of these methods is required to eliminate the problem of stiction. All of these techniques add to the complexity and cost of the MEMS device.

Thus, there is a need in the art, for a simple, low-cost way of reducing stiction in MEMS devices.

SUMMARY OF THE INVENTION

The disadvantages associated with the prior art are overcome by embodiments of the present the present invention directed to a method and apparatus for reducing stiction in a MEMS device having a movable element and a substrate. The method generally comprises providing the substrate with an anti-stiction member and interposing the anti-stiction member between the moveable element and the substrate. The apparatus generally comprises an anti-stiction member that is interposable between the moveable element and the substrate. Another embodiment of the invention of the invention is directed to a MEMS device, comprising: a substrate, a moveable element moveably coupled to the substrate, and an anti-stiction member that is interposable between the moveable element and the substrate. A further embodiment of the invention is directed to an optical switch. The optical switch generally includes a substrate, one or more moveable elements moveably coupled to the substrate, and an anti-stiction member that is interposable between at least one of the moveable elements and the substrate. The anti-stiction member may be in the form of a flexible cantilevered structure that overhangs the moveable element. Actuating the moveable element causes the anti-stiction member to flex and snap into place between the moveable element and the substrate.

An additional embodiment of the invention is directed to a method of fabricating a MEMS device. The method proceeds by providing a silicon-on-insulator (SOI) substrate; defining a moveable element from a device layer of the SOI substrate; and depositing a flexible material over the device layer and the moveable element. One or more portions of the flexible material overhang the moveable element, whereby the flexible material forms one or more anti-stiction members.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

This invention proposes a different method to reduce the contact area by building a novel structure that self-assembled. The approach of the present invention may complement other methods to more effectively eliminate stiction. This method is particularly suitable for (but is not limited to) devices built on SOI wafers. Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

Figure 1A:
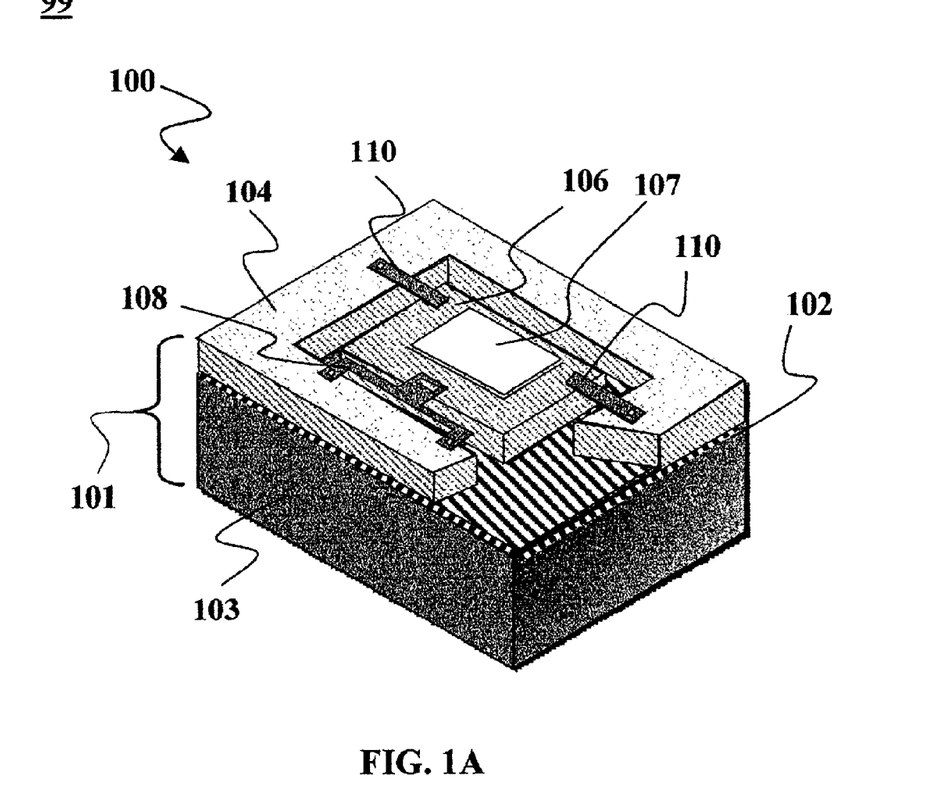
FIGS. 1A depict an isometric diagram illustrating an apparatus for reducing stiction in a MEMS device according to an embodiment of the present invention.

FIG. 1A depicts an example of an apparatus 99 for reducing stiction according to an embodiment of the present invention. The apparatus 99 generally includes a MEMS device 100 having a moveable element 106 moveably coupled to a substrate 101. In the example depicted in FIG. 1A the MEMS device 100 is formed from a silicon-on-insulator (SOI) substrate 101. The SOI substrate 101 includes an insulator layer 102 disposed between a support layer 103 and a device layer 104. The apparatus 99 includes one or more an anti-stiction members 110 that are interposable between the moveable element 106 and the support layer 103. The moveable element 106 may be formed from a portion of the device layer 104. The moveable element 106 may include a light-deflecting component 107 so that the apparatus 100 may operate as part of a MEMS optical switch. By way of example, the light-deflecting component 107 may be a simple plane reflecting (or partially reflecting) surface, curved reflecting (or partially reflecting) surface, prismatic reflector, refractive element, prism, lens, diffractive element, e.g. grating or fresnel lens, a dichroic coated surface for wavelength specific and bandpass selectivity, a waveguide or some combination of these.

A hinge 108 moveably attaches the moveable element 106 to the rest of the device layer 104. The hinge 108 is attached to the device layer and the moveable element. The hinge 108 may be made of a flexible material that flexes when a force or torque is exerted on the moveable element 106. In the embodiment shown, the hinge 108 allows the moveable element 106 to rotate with respect to the substrate 101. The hinge 108 may provide a torque that counters rotation of the movable element 106 with respect to the plane of the substrate 101. The hinge may be any suitable structure such as one or more torsion hinges, cantilever flexures, serpentine flexures, or pin-and-staple hinges combined with one or more springs. The hinge 108 may also be a flexible member that allows vertical movement of the movable element with respect to the plane of the substrate.

The anti-stiction members significantly decrease the area of contact between the moveable element 106 and the substrate 101. Many designs are possible for the anti-stiction members 110. In the example depicted in FIG. 1A, the anti-stiction members 110 are in the form of cantilevered bars that are attached to the device layer 102 but not to the moveable element 106. The anti-stiction members 110 substantially overhang the moveable element 106. The anti-stiction members 110 may be made from a flexible material such as polysilicon or metals commonly used in the semiconductor industry, e.g., Nickel, Tungsten, and the like. Alternatively, the anti-stiction members 110 may be made from a suitable polymer material. Furthermore, if the moveable element 106 is formed using a lithography and etch process, it is often desirable that the anti-stiction members 110 are made from a material that is resistant to the final release etch process that forms the moveable element 106. For example, polysilicon is resistant to hydrofluoric acid (HF). Although bar-shaped anti-stiction members are depicted in FIG. 1A, the invention is not limited to this particular configuration. Anti-stiction members having other shapes, such as serpentine, U-shaped, or L-shaped may also be used.

As used herein, the term flexible means that the anti-stiction members 110 have at least one portion that is capable of flexing. Although, flexibility may often be imparted by choice of material, the shape of the anti-stiction member may also impart some degree of flexibility.

Figure 1B:
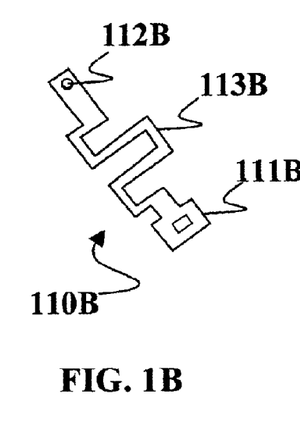
FIGS. 1B–1D depict schematic diagrams illustrating alternative configurations for anti-stiction members for use with an apparatus of the type depicted in FIG. 1A.
Figure 1C:
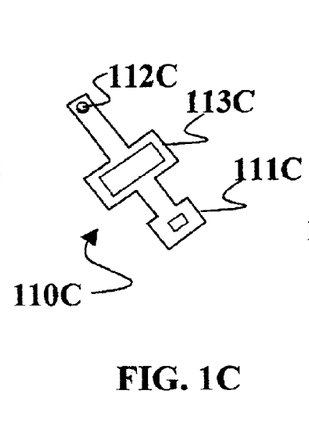
Figure 1D:
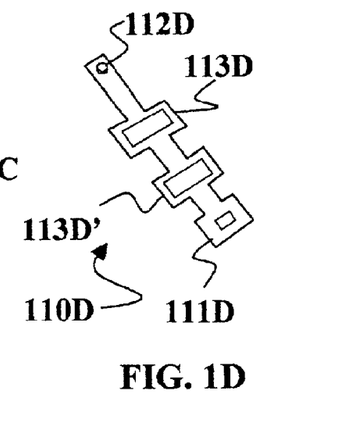

By way of example, and without loss of generality, FIGS. 1B–1D depict possible alternative shapes for the anti-stiction member 110. In FIG. 1B an anti-stiction member 110B has a serpentine portion 113B disposed between an anchor 111B and a stand-off 112B. The serpentine portion may impart flexibility to the anti-stiction member 110B. The anti-stiction member 110B may be attached to a substrate at the anchor 111B. The stand-off 112B at a free end of the anti-stiction member 110B reduces the contact area between the anti-stiction member and the underside of a MEMS device.

A serpentine shape such as that depicted in FIG. 1B may have an undesirable tendency to twist. To overcome this an anti-stiction member 110C may have double-serpentine hinge portion 113C located between a fixed end 111C and a free end 112C, as shown in FIG. 1C. The double-serpentine hinge portion 113C may be formed by making a hole in a widened portion of the anti-stiction member 110C. The double-serpentine hinge 113C is less susceptible to undesired twisting that the serpentine portion 113B depicted in FIG. 1B. Additional flexibility may be imparted by using two double-serpentine hinges 113D as shown in FIG. 1D. The double-serpentine hinges 113D are disposed between a fixed end 111D and a free end 112D of an anti-stiction member 110D.

Figure 1E:
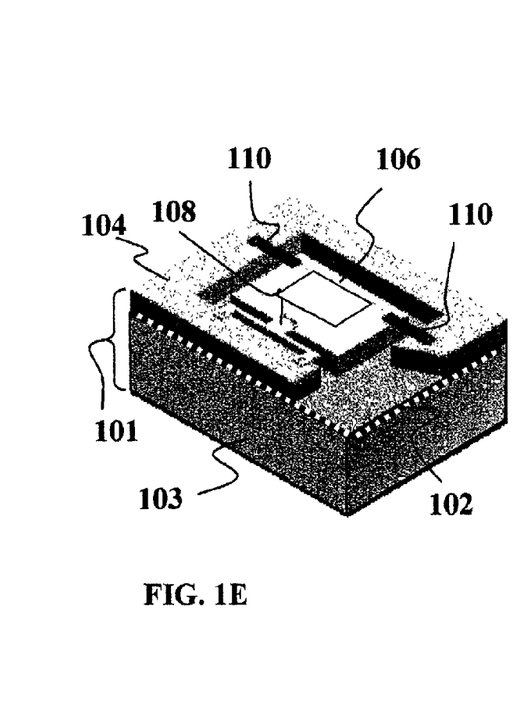
FIGS. 1E–1G depict a series of isometric diagram illustrating a method for reducing stiction in a MEMS device according to an embodiment of the present invention.
Figure 1F:
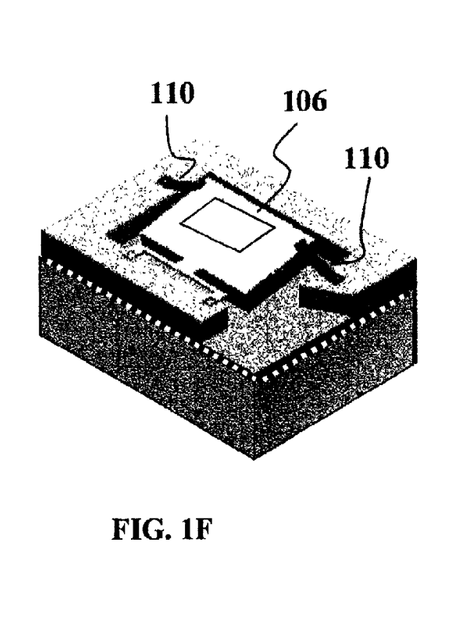
Figure 1G:
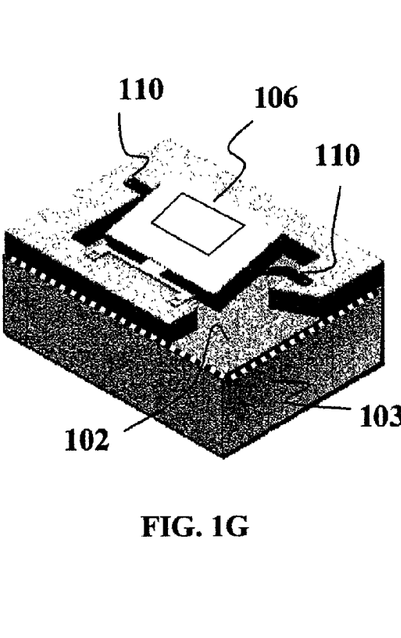

The operation of the anti-stiction bars is best understood by reference to FIGS. 1E–1G, which depict an example of a method of reducing stiction in a MEMS device according to an embodiment of the invention. The method begins at FIG. 1E by providing the substrate 101 with one or more anti-stiction members 110. The anti-stiction members 110 are then interposed between the moveable element 106 and the substrate 101 as illustrated in FIGS. 1F–1G. By way of example, the anti-stiction members 110 may be interposed between the moveable element 106 and the substrate 101 as follows. First, the moveable element 106 is actuated such that it engages the anti-stiction members 110, thereby causing them to flex. Any suitable mechanism may be used to actuate the moveable element 106. For example, a magnetic force or an electrostatic force may actuate the moveable element 106. The actuating force may cause the moveable element to rotate as shown in FIG. 1F. The more the moveable element 106 rotates, the more the anti-stiction members 110 flex. At some point the moveable element 106 will move so far that the anti-stiction members 110 flex past the moveable element 106 and snap into place between the moveable element 106 and the substrate 101. More specifically, the anti-stiction members 110 flex into position between the moveable element 106 and the support layer 103 as shown in FIG. 1G. In this position, the anti-stiction members 110 support the moveable element 106 and inhibit direct contact between the moveable element 106 and the underlying portion of the substrate 101, e.g. either the support layer 103 or the oxide layer 102. Although the anti-stiction members 110 may bias the moveable element 106 in a position that is slightly out of the plane and/or out of parallel with respect to the device layer 104 this is not a serious drawback. In MEMS applications, this position may correspond to an "OFF" state where the alignment of the moveable element is not critical. The out-of-parallel orientation may be corrected by using many pairs of anti-stiction members 110 to bias the moveable element 106 in a position that is substantially parallel to the device layer 104.

In a particular version of the method, the moveable element 106 may be actuated while it is immersed in a liquid. The surface tension forces that tend to cause stiction between the moveable element 106 and the substrate 101 may be eliminated when both are immersed in a liquid. Such actuation may be motivated, e.g., by a magnetic field provided by a magnet located outside the liquid. Post release stiction problems may be avoided by actuating the moveable element 106 in liquid and interposing the anti-stiction members 110 between the movable element 106 and the substrate 101 before removing the moveable element 106 and substrate 101 from the liquid. Such a procedure is useful, for example, after a wet etching process that releases the moveable element 106.

It is often desirable to electrically isolate the moveable element 106 from the substrate 101. The moveable anti-stiction member 110 must not create an undesirable short circuit between the moveable element 106 and the substrate 101. For example, if the moveable element 106 is to be electrostatically clamped to the substrate 101 a short circuit between them will undesirably cause a current to flow. The moveable element 106 may be electrically isolated, e.g., by an insulating material disposed between the anti-stiction member 110 and the device layer 104. Alternatively, a portion of the oxide layer 102 may electrically isolate the moveable element 106 from the support layer 103.

Figure 1H:
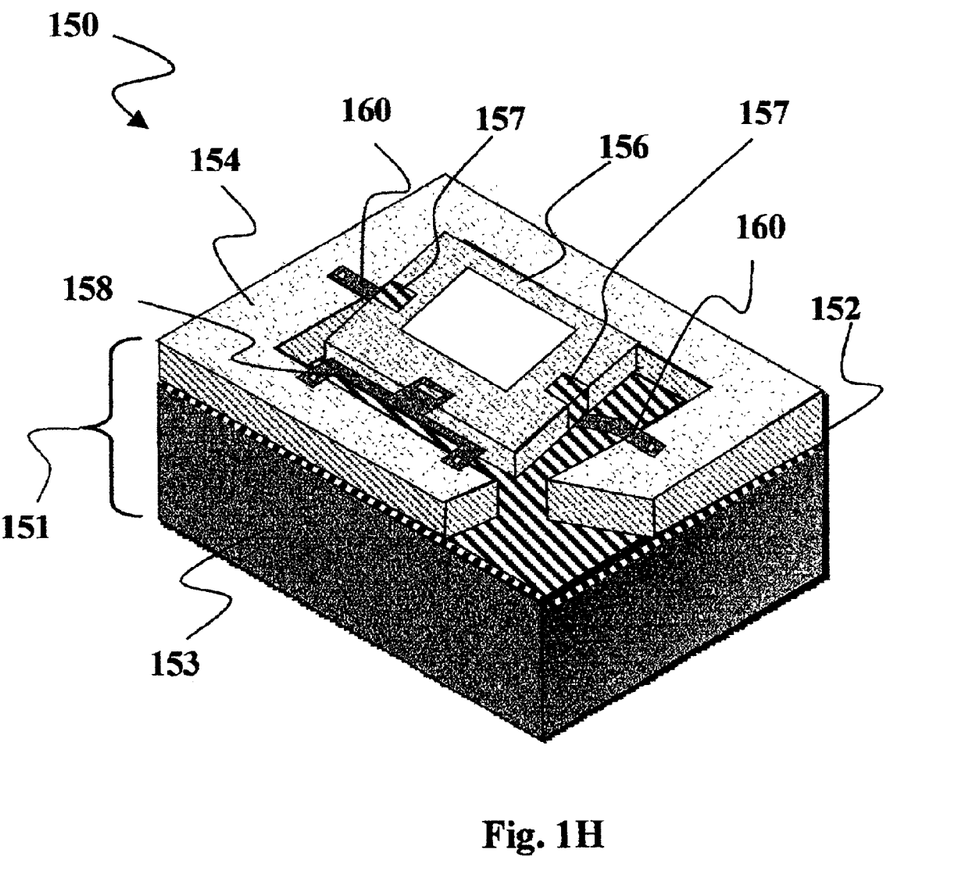
FIGS. 1H depicts an isometric diagram illustrating an alternative version of an apparatus for reducing stiction in a MEMS device according to an embodiment of the present invention.

An alternative scheme for electrically insulating a moveable element from anti-stiction members is depicted in FIG. 1H, which shows an apparatus 150 that has features in common with the apparatus 100 of FIG. 1A. In the apparatus 150 a moveable element 156 is formed from a device layer 154 of a substrate 151, which may also include an insulating layer 152 and a support layer 153. A hinge 158 moveably connects the moveable element to the device layer 154. Anti-stiction members 160 are interposeable between the moveable element 156 and the rest of the substrate 151. The moveable element 156 includes insulating portions 157 that contact anti-stiction members 160. The insulating portions 160 electrically isolate the anti-stiction members 160 from an electrically conductive portion of the moveable element 156 thereby electrically isolating the anti-stiction members 160 from the device layer 154. The insulating portions 157 may be formed by etching out sections of the moveable element 156 and filling in the etched out sections with insulating material. Similar insulating portions may be used to isolate the hinge 158 from the device layer 154.

The present invention also includes embodiments directed to MEMS devices. An example of such a MEMS device 200 is depicted in the cross-sections shown in FIGS. 2A–2C. The MEMS device 200 generally includes a moveable element 206, a substrate 201 and one or more an anti-stiction members 210 that are interposable between the moveable element 206 and the substrate 201. A hinge 208 moveably attaches the moveable element 206 to the rest of the device layer 204. The hinge 208 is attached to the device layer and the moveable element 206. The hinge 208 may be made of a flexible material that flexes when a torque is exerted on the moveable element 206. In the example depicted in FIGS. 2A–2C the MEMS device 200 is formed from a silicon on insulator (SOI) substrate 201 having an insulator layer 202 disposed between a support layer 203 and a device layer 204. The moveable element 206 is formed from a portion of the device layer 204. The moveable element 206 may include a light-deflecting component 207 of any of the types described above with respect to FIGS. 1A–1D. A magnetic material 209 such as nickel may be deposited on the moveable element 206 for magnetic actuation. The moveable element 206 may optionally include one or more standoffs 213 formed on an underside of the moveable element.

Figure 2A:
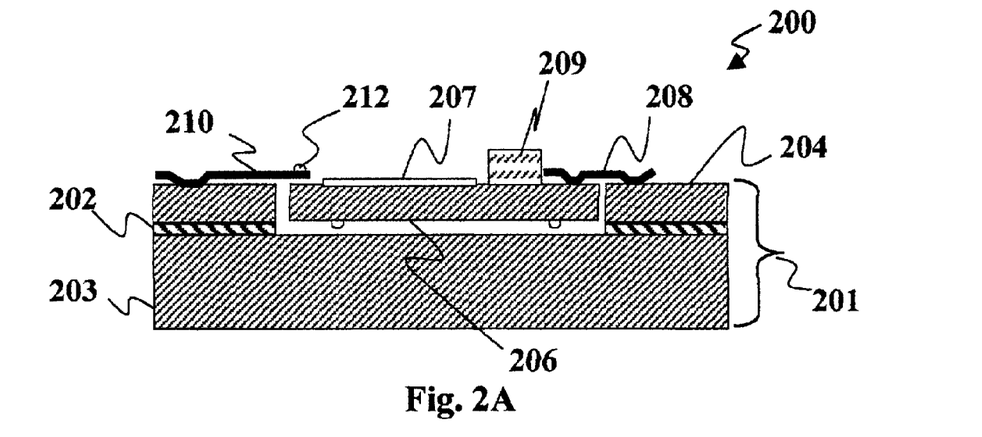
FIGS. 2A–2C depict cross-section schematic diagrams illustrating a MEMS device according to an embodiment of the invention.

The anti-stiction member 210 significantly decreases the area of contact between the moveable element 206 and the underlying portion of the substrate 201, e.g. insulating layer 204 and/or support layer 203. In the example depicted in FIGS. 2A–2C, the anti-stiction member 210 is in the form of a cantilevered bar that is attached to the device layer 204 but not to the moveable element 206. The anti-stiction member 210 substantially overhangs the moveable element 206. The overlap between the anti-stiction member 210 and the moveable element is preferably smaller than the overlap between the anti-stiction member and the device layer 204. The anti-stiction member may include a standoff 212 that minimizes the contact area between the anti-stiction member and the moveable element 206. The standoff 212 may be made from an insulating material to help electrically isolate the moveable element 206 from the substrate 201. The anti-stiction members 210 may be made from a flexible material and may have any suitable shape as described above. Although bar-shaped anti-stiction members are depicted in FIGS. 2A–2C, the invention is not limited to this particular configuration.

Figure 2B:
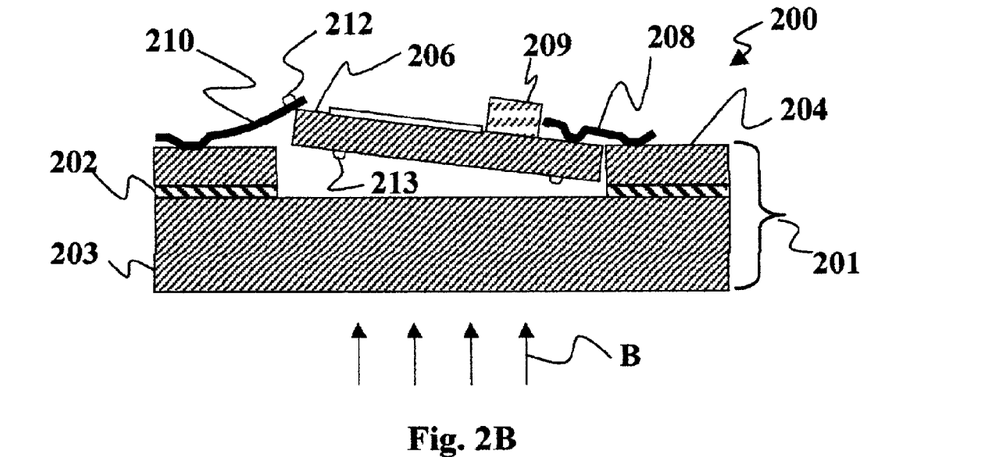
Figure 2C:
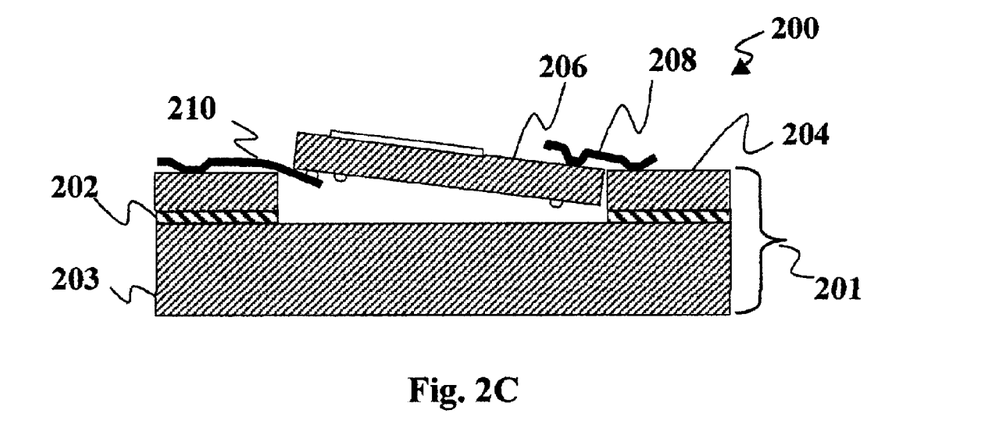

The operation of the anti-stiction members 210, as illustrated in FIGS. 2B–2C, proceeds substantially as described above with respect to FIGS. 1B–1D. Specifically, the anti-stiction members 210 may be interposed between the moveable element 206 and the substrate 201 by actuating the moveable element 206 such that it engages the anti-stiction members 210, thereby causing them to flex as shown in FIG. 2B. For example, a magnetic field B may exert a force on the magnetic material 209 to actuate the moveable element 206. At some point the moveable element 206 will move so far that the anti-stiction members 210 flex past the moveable element 206 and snap into place between the moveable element 206 and the substrate 201. In this position, the anti-stiction members 210 inhibit direct contact between the moveable element 206 and the underlying portion of the substrate 201, e.g. the oxide layer 202.

Figure 3A:
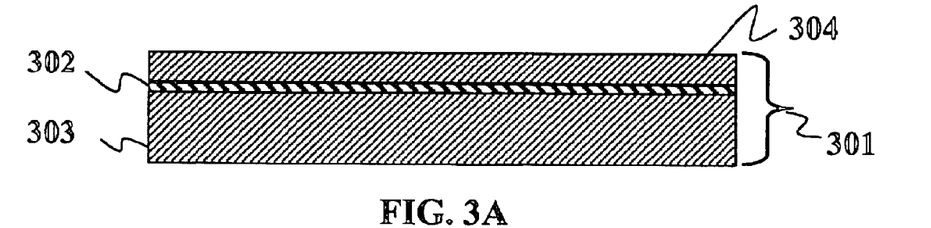
FIGS. 3A–3E depict a series of cross-sectional schematic diagrams illustrating the fabrication of a MEMS device according to an embodiment of the present invention.
Figure 3B:
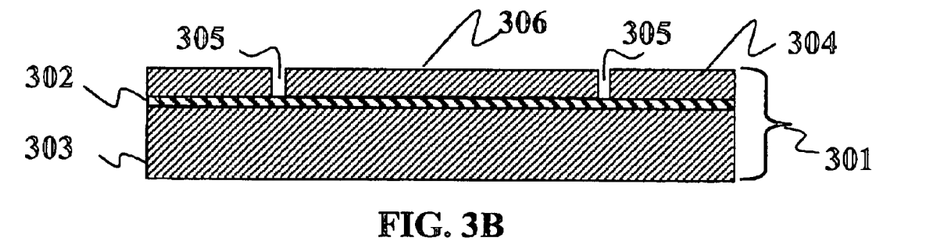
Figure 3C:
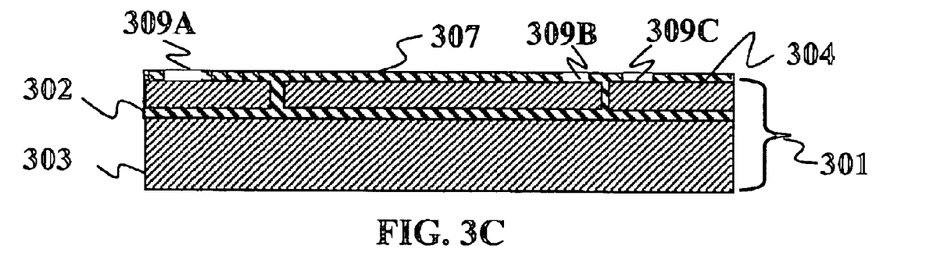

There are many ways of making a MEMS apparatus or device with anti-stiction members for reducing stiction as described above. FIGS. 3A–3E depict a series of cross-sections that illustrate an example of a method of fabricating of a MEMS device according to another embodiment of the invention. The method begins as shown in FIG. 3A with an SOI substrate 301 having an oxide layer 302 disposed between a support layer 303 and a device layer 304. One or more trenches 305 are etched in the device layer to define a moveable element 306 from the device layer 304 as shown in FIG. 3B. A light-deflecting component (not shown) may be formed on the moveable element either before or after forming the trenches 305. The trenches 305 are formed all the way through the device layer 304 to the oxide layer 302. Next a sacrificial layer 307 is formed over the device layer 304 as shown in FIG. 3C. The sacrificial layer may be, e.g., an oxide layer such as $SiO_2$. The sacrificial layer 307 is patterned with vias 309A, 309B, and 309C.

Figure 3D:
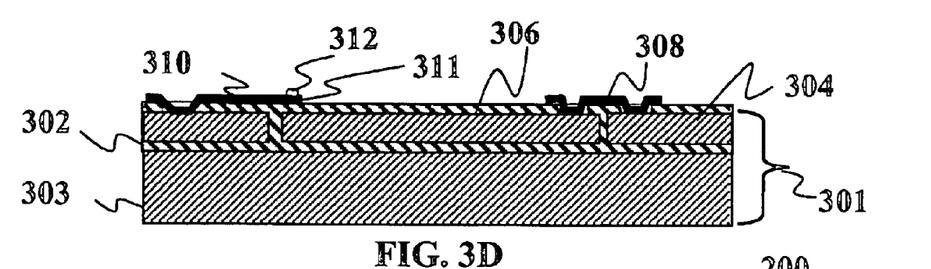

One or more patterns of flexible material are then deposited over the sacrificial layer 307 and into the vias 309A, 309B, and 309C as shown in FIG. 3D. By way of example, the flexible material may be polysilicon deposited by low pressure chemical vapor deposition (LPCVD). Alternatively, the flexible material may be a metal, such as Nickel or Tungsten that may be deposited by evaporation, sputtering, plating and the like. The flexible material provides a hinge 308 and an anti-stiction member 310. The anti-stiction member 310 substantially overhangs the moveable element 306 but is not attached to it. Via 309A provides a point of attachment between the anti-stiction member 310 and the device layer 304. Via 309B provides a point of attachment between the hinge 308 and the moveable element 306. Via 309C provides a point of attachment between the hinge 308 and the device layer 304. The anti-stiction member 310 and the hinge 308 may be formed from the same flexible material and they may be formed at the same time. Alternatively, the hinge 308 and the anti-stiction member 310 may be formed of different materials at different times. A standoff 312 may be formed at a free end 311 of the anti-stiction member 310, e.g. by patterned deposition of an insulating material.

Figure 3E:
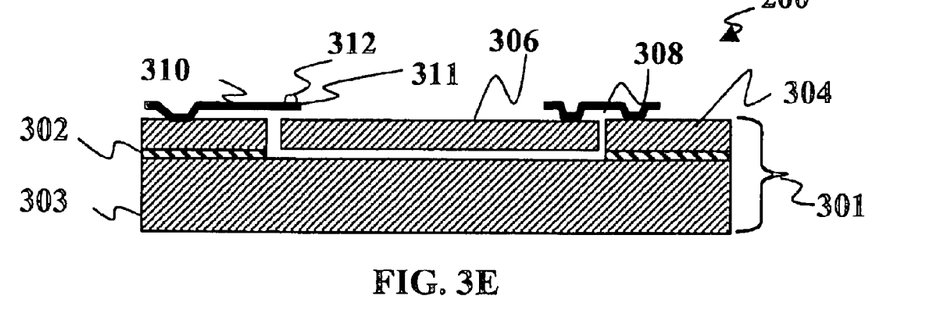

Once the anti-stiction member 310 and hinge 308 have been formed, the moveable element 306 may be released by etching away the sacrificial layer 307 as show in FIG. 3E. Such an etch process may be an isotropic etch in HF The process that etches the sacrificial layer 307 may also remove a portion of the oxide layer 302. The moveable element 306 remains attached to the device layer 304 by the hinge 308. The anti-stiction member 310 is attached to the device layer 304 but not the moveable element 306. The free end 311 of the anti-stiction member overhangs the moveable element 306 and may be interposed between the moveable element 306 and the support layer 303 in a manner similar to that shown and described above with respect to FIGS. 1B–1D and 2A–2C.

Figure 4A:
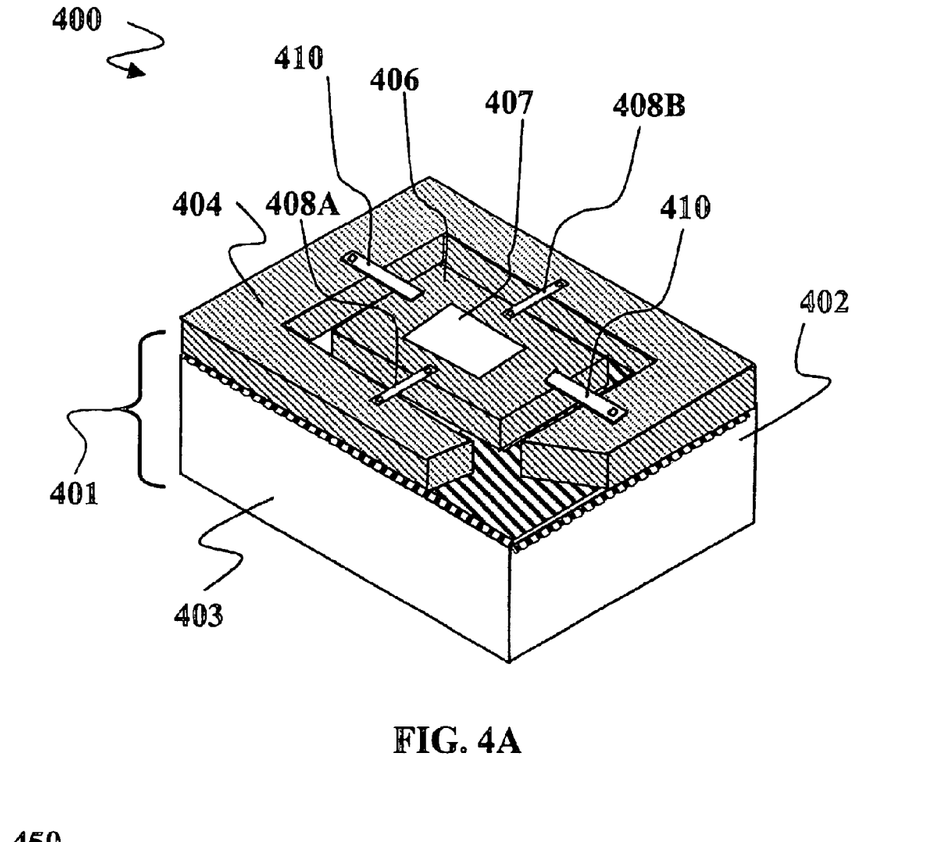
FIGS. 4A–4B depict alternative versions of MEMS devices according to an embodiment of the present invention.

The MEMS devices described above may be varied in many ways without departing from the scope of the invention. For example, anti-stiction members may be employed in beam steering MEMS elements. FIG. 4A depicts an isometric schematic diagram of such a MEMS device 400. The device 400 generally comprises a substrate 401 having, e.g., an insulator layer 402 disposed between a support layer 403 and a device layer 404. A moveable element 406 is formed from the device layer 404 and is attached to the rest of the device layer 404 by torsion hinges 408A, 408B. The moveable element 406 may include a light-deflecting element 407. The moveable element 406 may rotate about an axis through the torsion hinges 408A, 408B, e.g. under the influence of an actuating force, e.g., an electrostatic or magnetic force. Alternatively, the moveable element may move by translation, e.g., in a direction substantially perpendicular to the plane of the device layer 404. Anti-stiction members 410A, 410B may be interposed between the moveable element 406 and the support layer 403 as described above. Specifically, the moveable element 406 may rotate in one direction to interpose anti-stiction member 410A and then in an opposite direction to interpose anti-stiction member 410B. The anti-stiction members 410A, 410B may also provide mechanical biases to the moveable element 406.

Figure 4B:
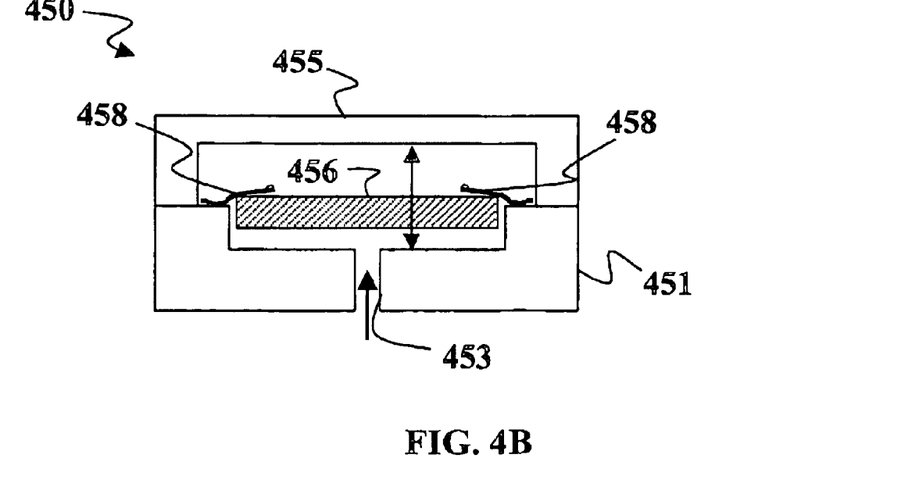

Although, moveable elements that rotate are described herein, the present invention is in no way limited to in rotating devices. An example of a MEMS device 450 that uses anti-stiction members with a translating moveable element is depicted in FIG. 4B. The device 450 generally comprises a substrate 451 and a moveable element 456. Flexible anti-stiction members 458 are interposable between the moveable element 456 and the substrate 451. In the device 450, the moveable element 456 is configured to translate in direction substantially perpendicular to the substrate 451 as shown by the double-ended arrow. By way of example, the moveable element is retained between the substrate 451 and a cap 455. The moveable element may move under the influence of a pneumatic force, e.g. provided by gas that enters the space between the substrate and the cap through a passage 453. Alternatively, the moveable element 456 may move under the influence of an electrostatic or magnetic force. The anti-stiction members 460 may be interposed between the substrate 451 and the movable element 456 by exerting an actuating force on the moveable element 456 causing it to move away from the substrate. Once the moveable element moves far enough, the anti-stiction members 460 flex past the moveable element 456 and into position between the moveable element 456 and the substrate 451.

Figure 5:
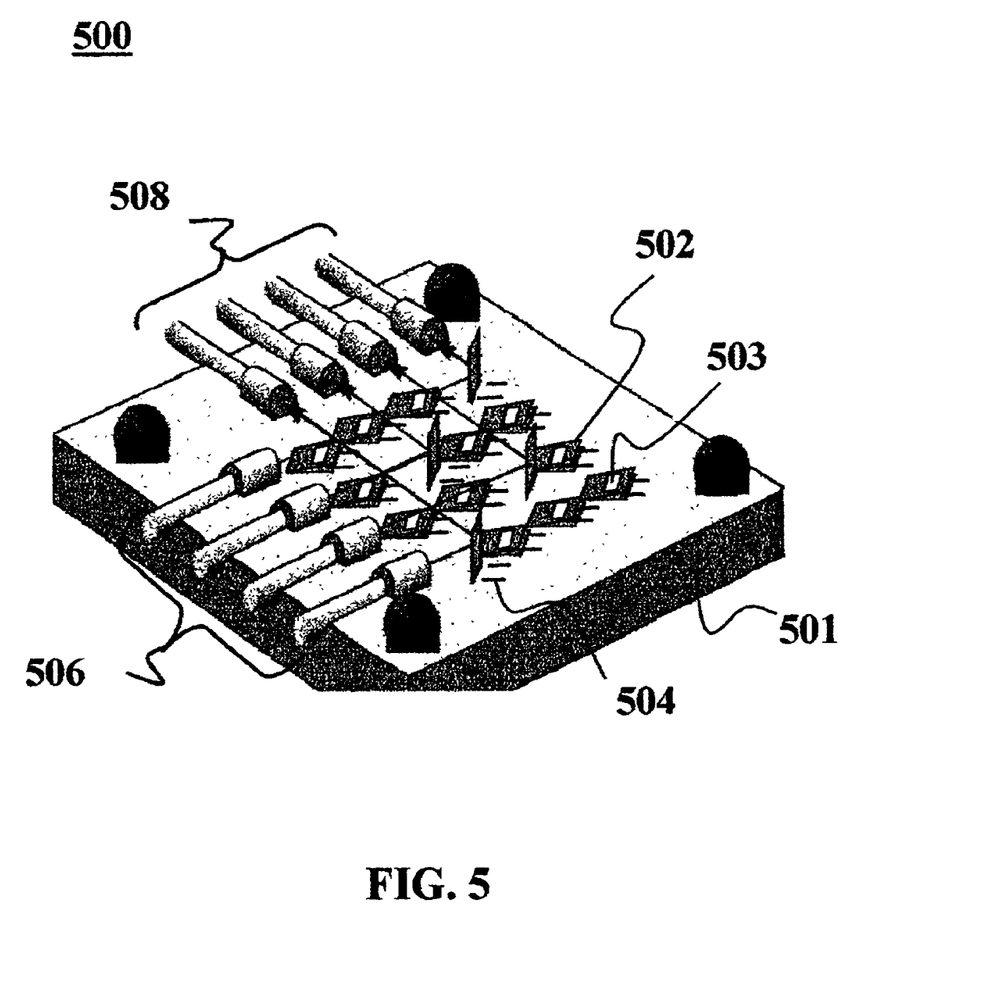
FIG. 5 depicts an isometric schematic diagram illustrating an optical switch according to an embodiment of the present invention.

The present invention also includes embodiments directed to systems that incorporate two or more MEMS apparatus, e.g. arranged in an array. An example of such an array is an optical switch 500 depicted in FIG. 5. The switch 500 generally comprises a substrate 501 having an array of moveable elements 502. Each moveable element is associated with one or more anti-stiction members 504. The anti-stiction members 504 are interposable between the associated moveable element 502 and the substrate 501. Each moveable element includes a light-deflecting component 503, e.g. of any of the types described above. By way of example, and without loss of generality, the light deflecting component 503 one each moveable element 502 may be a mirror. The light deflecting components 503 on the moveable elements 502 selectively couple optical signals 505 between one or more input fibers 506 and one or more output fibers 508.

While the above includes a complete description of the preferred embodiment of the present invention, it is possible to use various alternatives, modifications and equivalents. It should be understood that, though specific example applications are shown that relate to optical communications, the present invention may be applied to reduce stiction effects in a plurality of applications utilizing a moveable element. Such applications may include, but not be limited to, relays, mixers, pumps, accelerometers, RFMEMS, bioMEMS etc. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A method for reducing suction in a MEMS device having a moveable element moveably coupled to a substrate, the method comprising:
   a) providing the substrate with an anti-stiction member; and
   b) interposing the anti-stiction member between the moveable element and the substrate,
   wherein step b) includes actuating the moveable element to interpose the anti-stiction member between the moveable element and the substrate.

2. The method of claim 1 wherein step b) includes substantially immersing the moveable element in a liquid during actuation of the moveable element.

3. A method for reducing stiction in a MEMS device having a moveable element moveably coupled to a substrate, the method comprising:
   a) providing the substrate with an anti-stiction member; and
   b) interposing the anti-stiction member between the moveable element and the substrate,
   wherein step a) includes providing an anti-stiction member that overhangs the moveable element.

4. The method of claim 3, wherein the anti-stiction member includes one or more flexible portions.

5. The method of claim 4, wherein the one or more flexible portions includes at least one double-serpentine portion.

6. The method of claim 3 wherein the anti-stiction member is made of a flexible material.

7. The method of claim 3 wherein step b) includes actuating the moveable element whereby the moveable element engages the anti-stiction member causing the anti-stiction member to flex.

8. The method of claim 7 wherein step b) includes flexing the anti-stiction member sufficiently to interpose the anti-stiction member between the moveable element and the substrate.

9. A method for reducing stiction in a MEMS device having a moveable element moveably coupled to a substrate, the method comprising:
   a) providing the substrate with an anti-stiction member; and
   b) interposing the anti-stiction member between the moveable element and the substrate,
   wherein step a) includes:
   providing a silicon-on-insulator (SOI) substrate;
   forming the moveable element from a device layer of the SOI substrate; and
   depositing a flexible material over the device layer and the moveable element such that the flexible material overhangs the moveable element.

10. An apparatus for reducing stiction in a MEMS device having a moveable element moveably coupled to a substrate, the apparatus comprising:
    an anti-stiction member that is interposable between the moveable element and the substrate,
    wherein the anti-stiction member is attached to the substrate, wherein the anti-stiction member is not attached to the moveable element, wherein the anti-stiction member is cantilevered such that the anti-stiction member overhangs the moveable element.

11. An apparatus for reducing stiction in a MEMS device having a moveable element moveably coupled to a substrate, the apparatus comprising:
    an anti-stiction member that is interposable between the moveable element and the substrate,
    wherein the anti-stiction member is attached to the substrate, wherein the anti-stiction member is not attached to the moveable element, wherein the anti-stiction member is made from a flexible material.

12. An apparatus for reducing stiction in a MEMS device having a moveable element moveably coupled to a substrate, the apparatus comprising:
    an anti-stiction member that is interposable between the moveable element and the substrate,
    wherein the anti-stiction member is attached to the substrate, wherein the anti-stiction member is not attached to the moveable element, wherein the anti-stiction member includes one or more flexible portions disposed between a fixed end and a free end of the anti-stiction member.

13. The apparatus of claim 12 wherein the one or more flexible portions include at least one serpentine portion.

14. The apparatus of claim 12 wherein the one or more flexible portions include at least one double serpentine portion.

15. An apparatus for reducing stiction in a MEMS device having a moveable element moveably coupled to a substrate, the apparatus comprising:
    an anti-stiction member that is interposable between the moveable element and the substrate,
    wherein the anti-stiction member is attached to the substrate, wherein the anti-stiction member is not attached to the moveable element, further comprising a standoff attached to a free end of the anti-stiction member.

16. An apparatus for reducing stiction in a MEMS device having a moveable element moveably coupled to a substrate, the apparatus comprising:
    an anti-stiction member that is interposable between the moveable element and the substrate,
    wherein the anti-stiction member is attached to the substrate, wherein the anti-stiction member is not attached to the moveable element,
    further comprising means for electrically isolating the moveable element from a portion of the substrate, wherein the means for electrically isolating includes an electrically insulating standoff attached to a free end of the anti-stiction member.

17. An apparatus for reducing stiction in a MEMS device having a moveable element moveably coupled to a substrate, the apparatus comprising:
    an anti-stiction member that is interposable between the moveable element and the substrate,
    wherein the anti-stiction member is attached to the substrate, wherein the anti-stiction member is not attached to the moveable element,
    further comprising means for electrically isolating the moveable element from a portion of the substrate, wherein the anti-stiction member includes a serpentine shaped portion that is disposed between a free end and a fixed end of the anti-stiction member.

18. An apparatus for reducing stiction in a MEMS device having a moveable element moveably coupled to a substrate, the apparatus comprising:

an anti-stiction member that is interposable between the moveable element and the substrate,
wherein the anti-stiction member is attached to the substrate, wherein the anti-stiction member is not attached to the moveable element,
further comprising means for electrically isolating the moveable element from a portion of the substrate, wherein the anti-stiction member includes one or more double-serpentine shaped portions that are disposed between a free end and a fixed end of the anti-stiction member.

19. A MEMS device, comprising:
a substrate;
a moveable element moveably coupled to the substrate, and
an anti-stiction member that is interposable between the moveable element and the substrate,
wherein the anti-stiction member is cantilevered such that the anti-stiction member overhangs the moveable element.

20. A MEMS device, comprising:
a substrate;
a moveable element moveably coupled to the substrate, and
an anti-stiction member that is interposable between the moveable element and the substrate,
wherein the anti-stiction member is made from a flexible material.

21. A MEMS device, comprising:
a substrate;
a moveable element moveably coupled to the substrate, and
an anti-stiction member that is interposable between the moveable element and the substrate,
wherein the anti-stiction member includes one or more flexible portions disposed between a fixed end and a free end of the anti-stiction member.

22. The MEMS device of claim 21, wherein the one or more flexible portions include a serpentine portion.

23. The MEMS device of claim 21, wherein the one or more flexible portions include at least one double-serpentine portion.

24. A MEMS device, comprising:
a substrate;
a moveable element moveably coupled to the substrate, and
an anti-stiction member that is interposable between the moveable element and the substrate,
further comprising a standoff attached to a free end of the anti-stiction member.

25. A MEMS device, comprising:
a substrate;
a moveable element moveably coupled to the substrate, and
an anti-stiction member that is interposable between the moveable element and the substrate, further comprising means for electrically isolating the moveable element from a portion of the substrate, wherein the means for electrically isolating includes an electrically insulating standoff attached to a free end of the anti-stiction member.

26. The MEMS device of claim 25, wherein the means for electrically isolating includes an electrically insulating portion of the moveable element.

27. A method for fabricating a MEMS device, comprising:
providing a silicon-on-insulator (SOI) substrate;
forming a moveable element from a device layer of the SOI substrate; forming a sacrificial layer over the moveable element and a portion of the device layer and
depositing a flexible material over the sacrificial layer, the device layer and the moveable element such that one or more portions of the flexible material overhang the moveable element to form an anti-stiction member,
wherein the flexible material is deposited such that the anti-stiction member is attached to one end to a portion of the device layer,
wherein the flexible material is deposited such that the anti-stiction member is not attached to the moveable element; and etching the sacrificial layer to release the moveable element,
whereby the flexible material forms one or more anti-stiction members.

28. The method of claim 27, wherein the flexible material is resistant to an etchant that is used to remove the sacrificial layer.

29. An optical switch, comprising:
a substrate;
one or more moveable elements moveably coupled to the substrate, and
an anti-stiction member that is interposable between at least one of the moveable elements and the substrate, wherein the anti-stiction member is cantilevered such that the anti-stiction member overhangs the moveable element.

30. An optical switch, comprising:
a substrate;
one or more moveable elements moveably coupled to the substrate, and
an anti-stiction member that is interposable between at least one of the moveable elements and the substrate, wherein the anti-stiction member is made from a flexible material.

31. An optical switch, comprising:
a substrate;
one or more moveable elements moveably coupled to the substrate, and
an anti-stiction member that is interposable between at least one of the moveable elements and the substrate, wherein the anti-stiction member includes one or more flexible portions disposed between a fixed end and a free end of the anti-stiction member.

32. The optical switch of claim 31, wherein the flexible portion includes a serpentine portion.

33. The optical switch of claim 31, wherein the flexible portion includes at least one double serpentine portion.

34. An optical switch, comprising:
a substrate;
one or more moveable elements moveably coupled to the substrate, and
an anti-stiction member that is interposable between at least one of the moveable elements and the substrate, further comprising a standoff attached to a free end of the anti-stiction member.

* * * * *